US012676462B2

(12) United States Patent
Chen et al.

(10) Patent No.: US 12,676,462 B2
(45) Date of Patent: Jul. 7, 2026

(54) OPTICAL MODULATION AND AMPLIFICATION APPARATUS, OPTICAL MODULE, OPTICAL NETWORK UNIT, AND OPTICAL COMMUNICATION SYSTEM

(71) Applicant: Huawei Technologies Co., Ltd., Shenzhen (CN)

(72) Inventors: Guangcan Chen, Wuhan (CN); Yuanbing Cheng, Wuhan (CN); Yanbo Li, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 466 days.

(21) Appl. No.: 18/468,071

(22) Filed: Sep. 15, 2023

(65) Prior Publication Data

US 2024/0006859 A1 Jan. 4, 2024

Related U.S. Application Data

(63) Continuation of application No. PCT/CN2022/076157, filed on Feb. 14, 2022.

(30) Foreign Application Priority Data

Mar. 16, 2021 (CN) .......................... 202110279672.0

(51) Int. Cl.
| | |
|---|---|
| *H01S 5/50* | (2006.01) |
| *H01S 5/026* | (2006.01) |
| *H01S 5/34* | (2006.01) |

(52) U.S. Cl.
CPC .............. *H01S 5/50* (2013.01); *H01S 5/0261* (2013.01); *H01S 5/3407* (2013.01)

(58) Field of Classification Search
CPC ........ H01S 5/0265; H01S 5/0651; H01S 5/50; H01S 5/0261; H01S 5/0287;
(Continued)

(56) References Cited

U.S. PATENT DOCUMENTS

2015/0125159 A1 5/2015 Kim et al.

FOREIGN PATENT DOCUMENTS

| CN | 1423163 A | 6/2003 |
|---|---|---|
| CN | 1467889 A | 1/2004 |
| | (Continued) | |

OTHER PUBLICATIONS

Dong-Hun Lee et al., "Design and performance of 10-Gb/s L-band REAM-SOA for OLT Transmitter in next generation access networks", Optics Express, Jan. 2015, total 8 pages.
(Continued)

*Primary Examiner* — Melissa J Koval

(74) *Attorney, Agent, or Firm* — Slater Matsil, LLP

(57) ABSTRACT

An optical modulation and amplification apparatus, an optical module, an optical network unit, and an optical communication system are provided. The optical modulation and amplification apparatus includes an electric absorption modulator and a semiconductor optical amplifier. The electric absorption modulator and the semiconductor optical amplifier share a same substrate and a same multi-layer material structure. The multi-layer material structure includes, from bottom to top, at least a first quantum well, an electron blocking layer, a second quantum well, and an upper separate confinement layer. The electric absorption modulator is configured to modulate injection light by using the first quantum well, and the semiconductor optical amplifier is configured to amplify the injection light by using the second quantum well.

21 Claims, 10 Drawing Sheets

(58) Field of Classification Search
CPC .... H01S 5/1014; H01S 5/2009; H01S 5/2031;
H01S 5/22; H01S 5/3213; H01S 5/34;
H01S 5/3404; H01S 5/3407; H01S
5/5009; H04B 10/516
See application file for complete search history.

(56) References Cited

FOREIGN PATENT DOCUMENTS

| CN | 102162968 | A |   | 8/2011 |   |   |
|----|-----------|---|---|--------|---|---|
| CN | 111129944 | A |   | 5/2020 |   |   |
| CN | 115085003 | A | * | 9/2022 | .............. | H01S 5/34 |
| JP | H01257386 | A |   | 10/1989 |   |   |
| JP | H08160234 | A |   | 6/1996 |   |   |
| JP | 2011258785 | A |   | 12/2011 |   |   |
| JP | 2013258337 | A |   | 12/2013 |   |   |
| JP | 2019004093 | A |   | 1/2019 |   |   |

OTHER PUBLICATIONS

Dmitry Labukhin et al., "Polarization Insensitive Asymmetric Ridge Waveguide Design for Semiconductor Optical Amplifiers and Super Luminescent Light-Emitting Diodes", IEEE Journal of Quantum Electronics, vol. 42, No. 6, Nov. 2006, total 7 pages.

Dayan Ban et al., "Scanning Voltage Microscopy on Buried Heterostructure Multiquantum-Well Lasers: Identification of a Diode Current Leakage Path", IEEE Journal of Quantum Electronics, vol. 40, No. 2, Feb. 2004, total 5 pages.

Dan Zhou et al: "Electroabsorption modulators monolithically integrated with semiconductor optical amplifiers for zero insertion loss utilizing InGaAs/InGaAlAs MQW material", Optical Fiber Communication Conference. (OFC). Technical Digest Postconference Edition. Anaheim. CA. Mar. 17-22, 2001; [Trends in Optics and Photonics Series. Tops. vol. 54], Washington, WA: OSA, US, Mar. 17, 2001 (Mar. 17, 2001), XP032404102, total 3 pages.

Stegmueller B et al: "15-GHz modulation performance of integrated DFB laser diode EA modulator with identical multiple-quantum-well double-stack active layer", IEEE Photonics Technology Letters. IEEE. USA vol. 14, No. 12, Dec. 1, 2002 (Dec. 1, 2002), pp. 1647-1649, XP011426932.

Wartak M S et al: "The Effect of Thickness of Delta-Strained Layers in the Design of Polarization-Insensitive Semiconductor Optical Amplifiers", IEEE Photonics Technology Letters, IEEE, USA, vol. 16, No. 4, Apr. 1, 2004 (Apr. 1, 2004), pp. 996-998, XP011110184.

* cited by examiner

OPTICAL MODULATION AND AMPLIFICATION APPARATUS, OPTICAL MODULE, OPTICAL NETWORK UNIT, AND OPTICAL COMMUNICATION SYSTEM

CROSS-REFERENCE TO RELATED APPLICATIONS

This application is a continuation of International Application No. PCT/CN2022/076157, filed on Feb. 14, 2022, which claims priority to Chinese Patent Application No. 202110279672.0, filed on Mar. 16, 2021. The disclosures of the aforementioned applications are hereby incorporated by reference in their entireties.

TECHNICAL FIELD

This application relates to the field of optical communication, and in particular, to an optical modulation and amplification apparatus, an optical module, an optical network unit and an optical communication system.

BACKGROUND

In a current time division multiple access passive optical network (TDMA-PON), an optical network unit (ONU) sends an upstream optical signal in an allocated slot, and an optical line terminal (OLT) simultaneously sends downstream optical signals to a plurality of ONUs in a broadcast manner, and then each ONU selectively receives the downstream optical signals. In this time division multiplexing manner, it is difficult to increase effective bandwidth of a single ONU.

To meet a requirement for rate improvement, optical signals sent by a plurality of ONUs need to share a same wavelength. Specifically, in each ONU, an electric absorption modulator and an optical amplifier may be disposed to modulate and amplify remote injection light, to implement wavelength locking. However, the remote injection light transmitted by the OLT may be affected by environmental changes (for example, a stress and a temperature of an optical fiber) in a transmission process. Consequently, a polarization direction of injection light that reaches the ONU is random, and performance of the ONU is affected.

SUMMARY

Embodiments of this application provide an optical modulation and amplification apparatus, an optical module, an optical network unit, and an optical communication system, and the optical modulation and amplification apparatus is insensitive to polarization.

According to a first aspect, an embodiment of this application provides an optical modulation and amplification apparatus, including an electric absorption modulator and a semiconductor optical amplifier. The electric absorption modulator is electrically isolated from the semiconductor optical amplifier. A first waveguide of the electric absorption modulator and a second waveguide of the semiconductor optical amplifier are serially connected in a transmission direction of injection light. The first waveguide and the second waveguide each use a ridge waveguide structure. The electric absorption modulator and the semiconductor optical amplifier share a same substrate, and the electric absorption modulator and the semiconductor optical amplifier use a same multi-layer material structure. The multi-layer material structure is disposed on the substrate, and the multi-layer material structure includes, from bottom to top, a first quantum well, an electron blocking layer, a second quantum well, and an upper separate confinement layer. The first quantum well is used to modulate the injection light. The second quantum well is used to amplify the injection light. The electron blocking layer is used to block a current loaded to the second quantum well from flowing into the first quantum well. There is a first difference between an extinction ratio corresponding to a transverse electric (TE) mode and an extinction ratio corresponding to a transverse magnetic (TM) mode in the electric absorption modulator, where the first difference depends on a thickness of the upper separate confinement layer and a stress of the first quantum well, and the first difference is less than or equal to a first preset value. There is a second difference between a modal gain corresponding to the TE mode and a modal gain corresponding to the TM mode in the semiconductor optical amplifier, where the second difference depends on the thickness of the upper separate confinement layer and a stress of the second quantum well, and the second difference is less than or equal to a second preset value.

In this implementation, when the thickness of the upper separate confinement layer and the stress of the first quantum well meet a design requirement, the extinction ratio corresponding to the TE mode and the extinction ratio corresponding to the TM mode in the electric absorption modulator may be close to or equal to each other, in other words, the electric absorption modulator is insensitive to polarization. When the thickness of the upper separate confinement layer and the stress of the second quantum well meet the design requirement, the modal gain of the TE mode and the modal gain of the TM mode in the semiconductor optical amplifier may be close to or equal to each other, in other words, the semiconductor optical amplifier is insensitive to polarization. Therefore, even if a polarization direction of the injection light is random, performance of the optical modulation and amplification apparatus is not affected, in other words, the optical modulation and amplification apparatus provided in this application is insensitive to polarization. In addition, according to the design manner provided in this application, the electric absorption modulator and the semiconductor optical amplifier grow on the same substrate. This reduces a quantity of times of material epitaxy, and simplifies a process.

In some possible implementations, there is a third difference between an optical confinement factor of the TE mode and an optical confinement factor of the TM mode in the first quantum well. There is a fourth difference between a material absorption coefficient of the TE mode and a material absorption coefficient of the TM mode in the first quantum well. The first difference depends on the third difference and the fourth difference, where the third difference depends on the thickness of the upper separate confinement layer, and the fourth difference depends on the stress of the first quantum well. The third difference is less than or equal to a third preset value, and the fourth difference is less than or equal to a fourth preset value. In this implementation, parameters that are respectively affected by the thickness of the upper separate confinement layer and the first quantum well are described in detail, to enhance implementability of this solution.

In some possible implementations, there is a fifth difference between an optical confinement factor of the TE mode and an optical confinement factor of the TM mode in the second quantum well. There is a sixth difference between a material gain of the TE mode and a material gain of the TM mode in the second quantum well. The second difference depends on the fifth difference and the sixth difference, where the fifth difference depends on the thickness of the upper separate confinement layer, and the sixth difference depends on the stress of the second quantum well. The fifth difference is less than or equal to a fifth preset value, and the sixth difference is less than or equal to a sixth preset value. In this implementation, parameters that are respectively affected by the thickness of the upper separate confinement layer and the second quantum well are described in detail, to further enhance implementability of this solution.

In some possible implementations, on a premise that a material absorption coefficient of the first quantum well is fixed, to obtain a high absorption coefficient, the electric absorption modulator needs to have more optical confinement factors in the first quantum well. To obtain high output power, the semiconductor optical amplifier needs to have few optical confinement factors in the second quantum well. In this design manner, different requirements of the electric absorption modulator and the semiconductor optical amplifier for the optical confinement factors can be implemented in a same structure.

In some possible implementations, multi-layer material structures on two sides of the semiconductor optical amplifier using the second waveguide as an axis are symmetrical. In other words, thickness distribution of each layer of a material structure is uniform. In this manner, the thickness of the upper separate confinement layer may be limited, so that the upper separate confinement layer is not too thick, and the optical confinement factors in the first quantum well and the second quantum well are regulated separately.

In some possible implementations, multi-layer material structures on two sides of the electric absorption modulator using the first waveguide as an axis are etched, to form a structure of a deep ridge waveguide. This reduces impact of a parasitic capacitance and a junction capacitance on the electric absorption modulator.

In some possible implementations, an etched region on the electric absorption modulator is filled with a low-dielectric-constant material such as polyimide or benzocyclobutene, to further reduce impact of the parasitic capacitance and the junction capacitance on the electric absorption modulator.

In some possible implementations, the thickness H of the upper separate confinement layer meets 75 nm≤H≤95 nm, so that the optical confinement factor of the TE mode and the optical confinement factor of the TM mode in the first quantum well and the second quantum well are close to or equal to each other.

In some possible implementations, a length L of the first waveguide meets L≤400 μm, to be specific, an overall length of the electric absorption modulator is less than or equal to 400 μm, so that light absorbed in the first quantum well of the electric absorption modulator can be reduced, and there are more optical confinement factors in the first quantum well.

In some possible implementations, widths W of the ridge waveguide structures of both the first waveguide and the second waveguide meet 1.5 μm≤W≤3 μm. It should be understood that, compared with a manufacturing process of using a buried heterostructure waveguide, a manufacturing process of using the ridge waveguide structure is simpler.

In some possible implementations, the optical modulation and amplification apparatus further includes a controller, a voltage source, and a current source. The controller is configured to control the voltage source to load a voltage output by the voltage source onto the electric absorption modulator, to modulate the injection light. The controller is configured to control the current source to load a current output by the current source onto the semiconductor optical amplifier, to amplify the injection light. In this implementation, a working mode of the optical modulation and amplification apparatus in this application is described, to improve practicability of this solution.

In some possible implementations, a groove is disposed between an electrode of the electric absorption modulator and an electrode of the semiconductor optical amplifier, where the groove may increase an isolation resistance between the electric absorption modulator and the semiconductor optical amplifier, to implement electrical isolation between the electric absorption modulator and the semiconductor optical amplifier.

In some possible implementations, protons or inert ions may be further injected into the groove, to improve an electrical isolation effect.

In some possible implementations, protons or inert ions are injected between an electrode of the electric absorption modulator and an electrode of the semiconductor optical amplifier, to implement electrical isolation between the electric absorption modulator and the semiconductor optical amplifier. Compared with a design manner in which the groove is disposed, flexibility of this solution is improved.

According to a second aspect, an embodiment of this application provides an optical module, where the optical module includes the optical modulation and amplification apparatus according to any one of the implementations of the first aspect and a driver. The driver is configured to drive the optical modulation and amplification apparatus to modulate and amplify injection light.

According to a third aspect, an embodiment of this application provides an optical network unit (ONU), where the ONU includes the optical module according to the second aspect and a media access control (MAC) chip. The optical module is configured to convert an electrical signal output by the MAC chip into an optical signal.

According to a fourth aspect, an embodiment of this application provides an optical communication system, including an optical line terminal (OLT) and the ONU according to the third aspect. Specifically, the OLT is configured to transmit injection light to the ONU.

In embodiments of this application, the optical modulation and amplification apparatus includes the electric absorption modulator and the semiconductor optical amplifier, where the electric absorption modulator and the semiconductor optical amplifier share the same substrate and the same multi-layer material structure. When the thickness of the upper separate confinement layer and the stress of the first quantum well meet the design requirement, the extinction ratio corresponding to the TE mode and the extinction ratio corresponding to the TM mode in the electric absorption modulator may be close to or equal to each other, in other words, the electric absorption modulator is insensitive to polarization. When the thickness of the upper separate confinement layer and the stress of the second quantum well meet the design requirement, the modal gain of the TE mode and the modal gain of the TM mode in the semiconductor optical amplifier may be close to or equal to each other, in other words, the semiconductor optical amplifier is insensitive to polarization. Therefore, even if the polarization direction of the injection light is random, performance of the optical modulation and amplification apparatus is not affected, in other words, the optical modulation and amplification apparatus provided in this application is insensitive to polarization. In addition, according to the design manner provided in this application, the electric absorption modulator and the semiconductor optical amplifier grow on the same substrate. This reduces the quantity of times of material epitaxy, and simplifies the process.

BRIEF DESCRIPTION OF THE DRAWINGS

FIG. 5(*b*) is a diagram of a change trend of a percentage of a difference between optical confinement factors of a TE mode and a TM mode in a second quantum well with a thickness of an upper separate confinement layer;

FIG. 7(*b*) is a diagram of a change trend of a percentage of a difference between optical confinement factors of a TE mode and a TM mode in a first quantum well with a thickness of an upper separate confinement layer;

DETAILED DESCRIPTION OF ILLUSTRATIVE EMBODIMENTS

Embodiments of this application provide an optical modulation and amplification apparatus, an optical module, an optical network unit, and an optical communication system, where the optical modulation and amplification apparatus is insensitive to polarization.

This application is mainly applied to an optical communication system of a passive optical network (PON). The following first describes a PON system.

Figure 1:
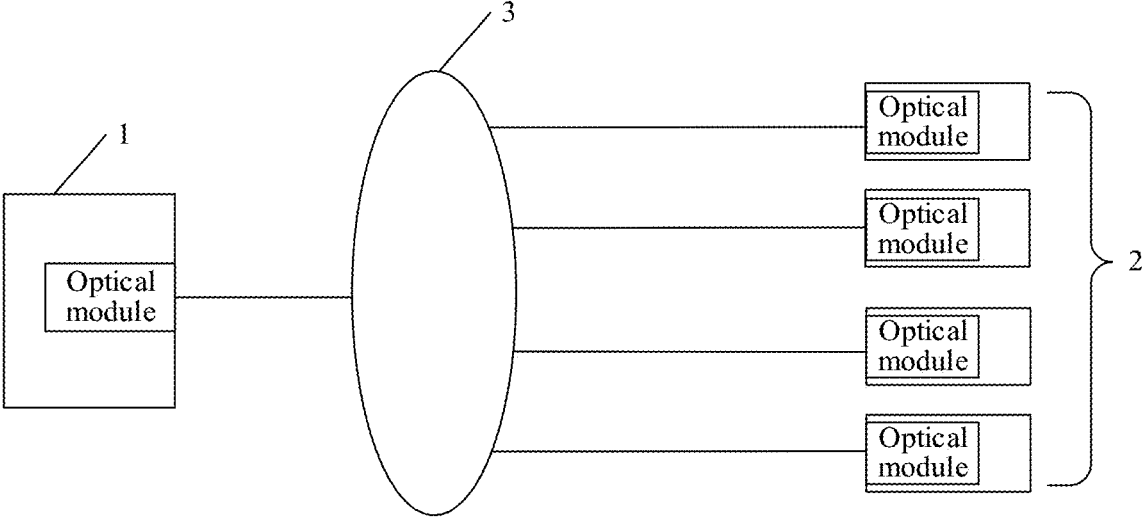
FIG. 1 is a schematic structural diagram of a PON system.

FIG. 1 is a schematic structural diagram of the PON system. Network devices in the PON system include an optical line terminal (OLT) 1 and an optical network unit (ONU) 2. An optical distribution network (ODN) 3 is deployed between the optical line terminal 1 and the optical network unit 2. An optical module is disposed in each of the optical line terminal 1 and the optical network unit 2.

It should be noted that, to meet a requirement for rate improvement, optical signals sent by a plurality of ONUs need to share a same wavelength. This may be specifically implemented by the ONU through remote optical injection locking. However, remote injection light transmitted by the OLT may be affected by environment changes (for example, a stress and a temperature of an optical fiber) in a transmission process. Consequently, a polarization direction of injection light that reaches the ONU is random, and performance of the ONU is affected. Therefore, this application provides an optical modulation and amplification apparatus applied to an optical module in the ONU. Even if the polarization direction of the injection light is random, performance of the optical modulation and amplification apparatus is not affected. In other words, the optical modulation and amplification apparatus provided in this application is insensitive to polarization. The following describes in detail the optical modulation and amplification apparatus provided in this application.

Figure 2:
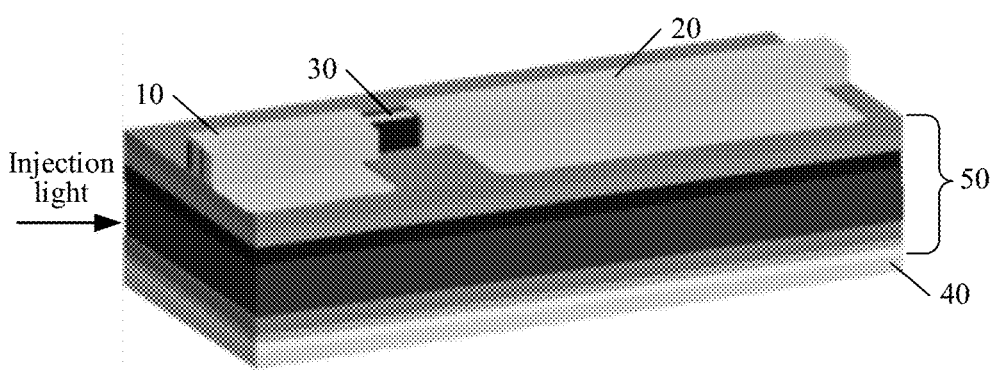
FIG. 2 is a first schematic structural diagram of an optical modulation and amplification apparatus according to an embodiment of this application.

FIG. 2 is a first schematic structural diagram of an optical modulation and amplification apparatus according to an embodiment of this application. As shown in FIG. 2, the optical modulation and amplification apparatus includes an electric absorption modulator 10 and a semiconductor optical amplifier 20. The electric absorption modulator 10 is configured to modulate injection light from a remote end. The semiconductor optical amplifier 20 is configured to amplify the injection light. In a first possible implementation, the injection light may be injected from an end face of the electric absorption modulator 10, and then the injection light is output from an end face of the semiconductor optical amplifier 20 after being transmitted through a waveguide 30. In other words, the injection light is first modulated by using the electric absorption modulator 10, and then the modulated injection light is amplified by using the semiconductor optical amplifier 20. In a second possible implementation, the injection light may alternatively be injected from an end face of the semiconductor optical amplifier 20, and then the injection light is output from an end face of the electric absorption modulator 10 after being transmitted through a waveguide 30. In other words, the injection light may alternatively be first amplified by using the semiconductor optical amplifier 20, and then the amplified injection light is modulated by using the electric absorption modulator 10. In the foregoing two implementations, both the end face of the electric absorption modulator 10 and the end face of the semiconductor optical amplifier 20 may be plated with an anti-reflective (AR) film, to increase incident optical power and emergent optical power. In a third possible implementation, the injection light is injected from one end face of the electric absorption modulator 10 or the semiconductor optical amplifier 20. After being transmitted to another end face through a waveguide 30, the injection light is reflected back, and after being transmitted through the waveguide 30, the injection light is output from the end face to which the injection light is injected. In other words, the injection light is modulated and amplified twice in a round-trip process. An end face used for light injection and light output may be plated with the AR film, and an end face used for light reflection may be plated with a highly reflective (HR) film.

The electric absorption modulator 10 is electrically isolated from the semiconductor optical amplifier 20. A first waveguide of the electric absorption modulator 10 and a second waveguide of the semiconductor optical amplifier 20 are serially connected in a transmission direction of the injection light. The first waveguide and the second waveguide that are serially connected are located at a position shown by the waveguide 30 in FIG. 2. In addition, the first waveguide of the electric absorption modulator 10 and the second waveguide of the semiconductor optical amplifier 20 each use a ridge waveguide structure shown in FIG. 2. Preferably, a width W of the ridge waveguide structure should meet 1.5 µm≤W≤3 µm. It should be understood that, compared with a manufacturing process of using a buried heterostructure waveguide, a manufacturing process of using the ridge waveguide structure is simpler.

The electric absorption modulator 10 and the semiconductor optical amplifier 20 share a same substrate 40. In addition, the electric absorption modulator 10 and the semiconductor optical amplifier 20 use a same multi-layer material structure 50. The multi-layer material structure 50 is disposed on the substrate 40. It should be understood that both the electric absorption modulator 10 and the semiconductor optical amplifier 20 are manufactured based on the substrate 40. The electric absorption modulator 10 is not limited to a part growing on the substrate 40, and the substrate 40 is also a part of the electric absorption modulator 10. Similarly, the semiconductor optical amplifier 20 is not limited to a part growing on the substrate 40, and the substrate 40 is also a part of the semiconductor optical amplifier 20. In other words, the electric absorption modulator 10, the semiconductor optical amplifier 20, and the substrate 40 constitute a monolithic integration structure. The following describes in detail composition of the multi-layer material structure 50.

Figure 3:
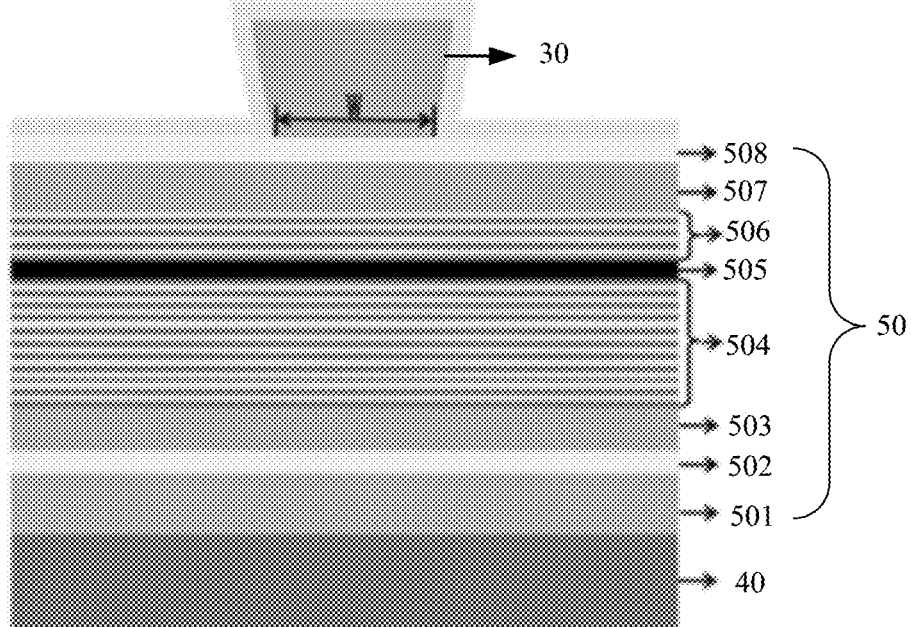
FIG. 3 is a first side view of an optical modulation and amplification apparatus according to an embodiment of this application.

FIG. 3 is a first side view of an optical modulation and amplification apparatus according to an embodiment of this application. The multi-layer material structure 5o includes, from bottom to top, at least a first quantum well 504, an electron blocking layer 505, a second quantum well 506, and an upper separate confinement layer 507. An absorption coefficient of the first quantum well 504 changes with a loaded voltage. Therefore, an intensity of injection light may be modulated by adjusting a voltage loaded to the first quantum well 504. A gain may be provided for the injection light by loading a current to the second quantum well 5o6. The electron blocking layer 505 is configured to block the current loaded to the second quantum well from flowing into the first quantum well 504, so that the second quantum well 5o6 has a high carrier concentration to provide a high gain for the injection light, and the first quantum well 504 has no current injection and therefore provide no gain. The upper separate confinement layer 507 is configured to limit light in quantum wells.

It should be understood that, in an actual application, the multi-layer material structure is not limited to the foregoing described structures. In a possible implementation, as shown in FIG. 3, the multi-layer material structure sequentially includes, from bottom to top, a buffer layer 501, inner N-cladding 502, a lower separate confinement layer 503, the first quantum well 504, the electron blocking layer 505, the second quantum well 506, the upper separate confinement layer 507, and inner P-cladding 508.

It should be noted that, although the electric absorption modulator 10 and the semiconductor optical amplifier 20 use the same multi-layer material structure 50, a difference lies in that when the electric absorption modulator 10 works, the electric absorption modulator modulates the injection light by using only the first quantum well 504, not using the second quantum well 506. When the semiconductor optical amplifier 20 works, the semiconductor optical amplifier 20 amplifies the injection light by using only the second quantum well 506, not using the first quantum well 504. The following describes working manners of the electric absorption modulator 10 and the semiconductor optical amplifier 20 by using a specific implementation.

Figure 4:
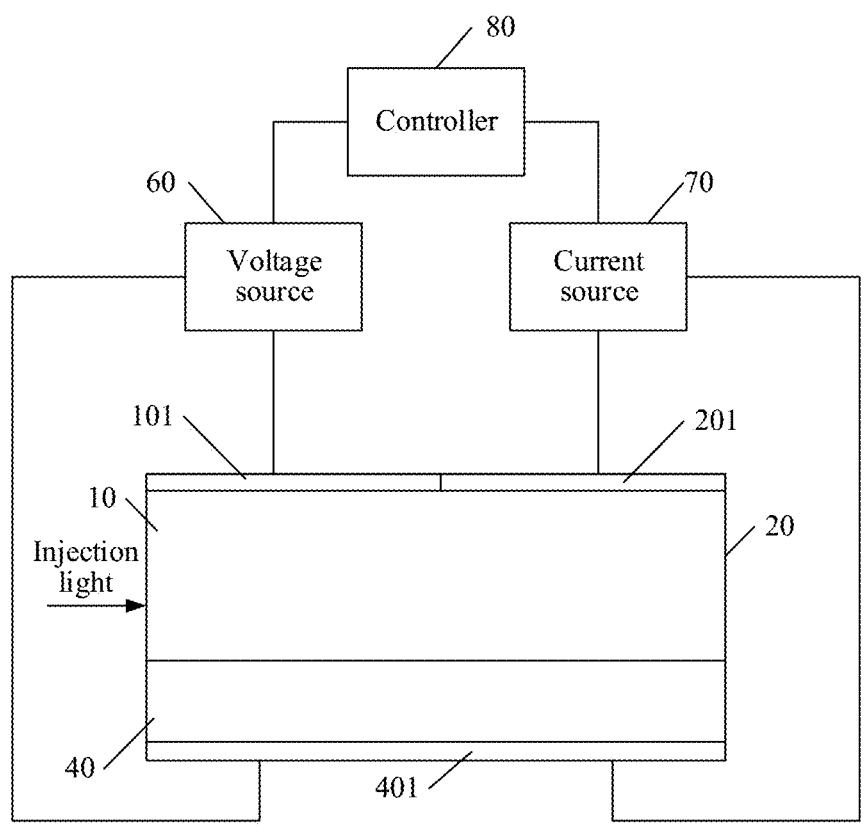
FIG. 4 is a second schematic structural diagram of an optical modulation and amplification apparatus according to an embodiment of this application.

FIG. 4 is a second schematic structural diagram of an optical modulation and amplification apparatus according to an embodiment of this application. In a possible implementation, the optical modulation and amplification apparatus further includes a voltage source 60, a current source 70, and a controller 80. A P-type electrode 101 is disposed on an upper surface of the electric absorption modulator 10. A P-type electrode 201 is disposed on an upper surface of the semiconductor optical amplifier 20. An N-type electrode 401 is disposed on a lower surface of the substrate 40. The controller 80 is configured to control the voltage source 60 to load an output voltage to the P-type electrode 101 of the electric absorption modulator 10 and the N-type electrode 401. Specifically, a voltage may be injected into the first quantum well 504, to modulate the injection light. The controller 80 is further configured to control the current source 70 to load an output current to the P-type electrode 201 of the semiconductor optical amplifier 20 and the N-type electrode 401. Specifically, a current may be injected into the second quantum well 506, to amplify the injection light.

It should be understood that the injection light in the electric absorption modulator and the semiconductor optical amplifier may be in a transverse electric (TE) mode and a transverse magnetic (TM) mode. To implement that the semiconductor optical amplifier is insensitive to polarization, modal gains of the TE mode and the TM mode in the semiconductor optical amplifier need to be close to or equal to each other. This may be specifically implemented by adjusting a thickness of the upper separate confinement layer and a stress of the second quantum well. To implement that the electric absorption modulator is insensitive to polarization, an extinction ratio corresponding to the TE mode and an extinction ratio corresponding to the TM mode in the electric absorption modulator needs to be close to or equal to each other. This may be specifically implemented by adjusting the thickness of the upper separate confinement layer and a stress of the first quantum well. The following separately provides detailed descriptions.

1. The semiconductor optical amplifier is insensitive to polarization.

The thickness of the upper separate confinement layer may affect an optical confinement factor of the TE mode and an optical confinement factor of the TM mode in the second quantum well. The optical confinement factor is a parameter used to measure a confinement effect of the second quantum well on light. When the thickness of the upper separate confinement layer meets a specific condition, the optical confinement factor of the TE mode and the optical confinement factor of the TM mode in the second quantum well are close to or equal to each other. Therefore, the confinement effect of the second quantum well on light in the TE mode is similar to or the same as that on light in the TM mode. The following provides descriptions by using an example.

Figure 5A:
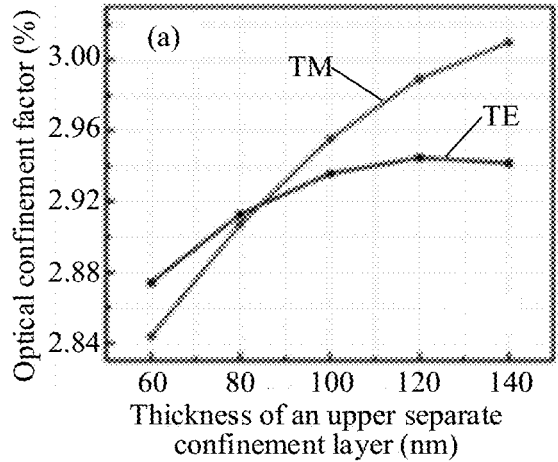
FIG. 5(*a*) is a diagram of a change trend of an optical confinement factor in a second quantum well with a thickness of an upper separate confinement layer.
Figure 5B:
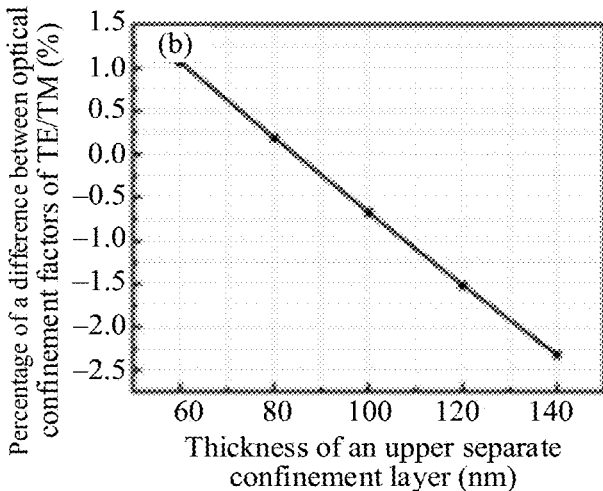

FIG. 5(a) is a diagram of a change trend of an optical confinement factor in a second quantum well with a thickness of an upper separate confinement layer. FIG. 5(b) is a diagram of a change trend of a percentage of a difference between optical confinement factors of a TE mode and a TM mode in a second quantum well with a thickness of an upper separate confinement layer. As shown in FIG. 5(a), a horizontal coordinate represents the thickness of the upper separate confinement layer, and a vertical coordinate represents the optical confinement factor in the second quantum well. It can be seen that, when the thickness of the upper separate confinement layer is 85 nm, the optical confinement factor of the TE mode and the optical confinement factor of the TM mode are equal to each other, and both are 2.91%. As shown in FIG. 5(b), a horizontal coordinate represents the thickness of the upper separate confinement layer, and a vertical coordinate represents the percentage of the difference between the optical confinement factors of the TE mode and TM mode in the second quantum well. It can also be seen that, when the thickness of the upper separate confinement layer is 85 nm, the percentage of the difference between the optical confinement factors of the TE mode and the TM mode in the second quantum well is 0, in other words, the optical confinement factor of the TE mode is equal to the optical confinement factor of the TM mode. It should be understood that, in an actual application, the thickness H of the upper separate confinement layer should meet 75 nm≤H≤95 nm.

Figure 6:
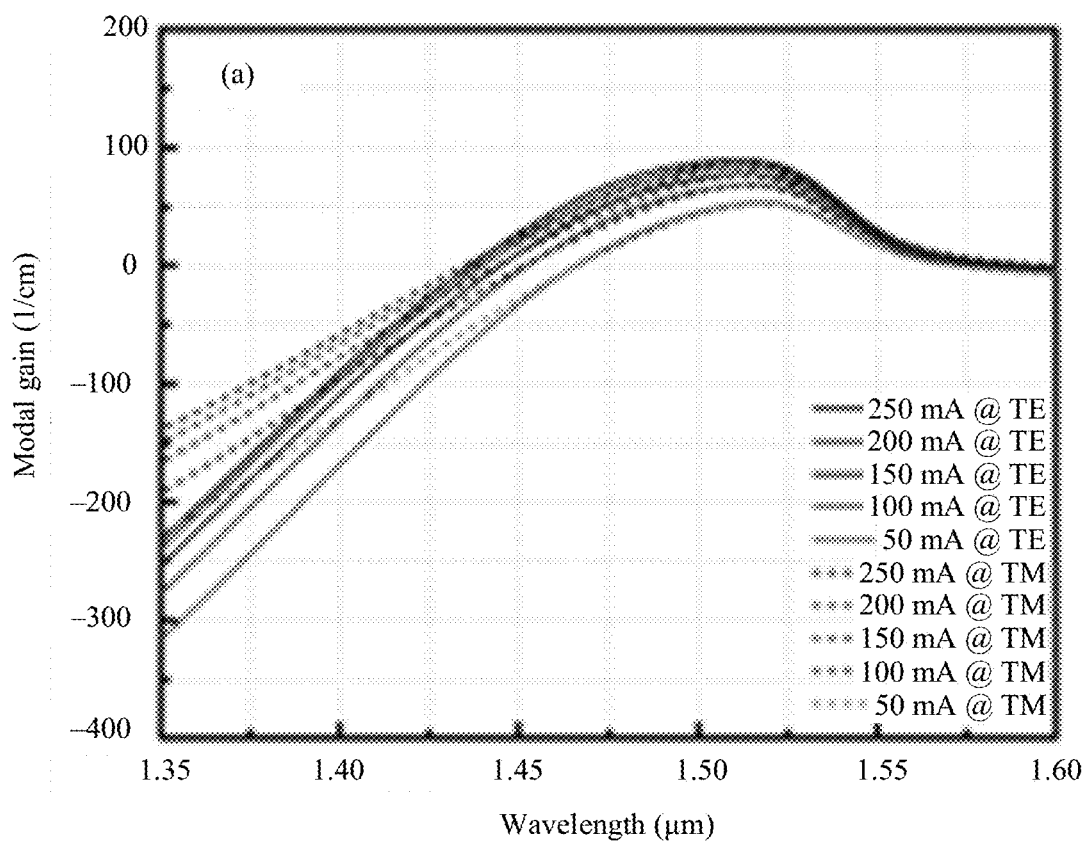
FIG. 6 is a schematic diagram of modal gains of a TE mode and a TM mode in a semiconductor optical amplifier under different injection current conditions.

It should be noted that, on a premise that the optical confinement factor of the TE mode and the optical confinement factor of the TM mode in the second quantum well are close to or equal to each other, material gains of the TE mode and the TM mode in the second quantum well need to be close to or equal to each other. In this way, the modal gains of the TE mode and the TM mode are close to or equal to each other in the semiconductor optical amplifier. Specifically, the stress of the second quantum well may affect the material gains of the TE mode and the TM mode. Therefore, when the stress of the second quantum well meets a specific condition, the material gains of the TE mode and the TM mode are close to or equal to each other, so that the modal gains of the TE mode and the TM mode are close to or equal to each other. FIG. 6 is a schematic diagram of modal gains of a TE mode and a TM mode in a semiconductor optical amplifier under different injection current conditions. As shown in FIG. 6, a horizontal coordinate represents a wavelength, and a vertical coordinate represents a modal gain. It can be seen that, in a waveband of 1510 nm to 1535 nm, modal gains of the TE mode and the TM mode are close to or equal to each other, so that the semiconductor optical amplifier is insensitive to polarization.

2. The electric absorption modulator is insensitive to polarization.

Similar to the second quantum well, the thickness of the upper separate confinement layer may also affect the optical confinement factor of the TE mode and the optical confinement factor of the TM mode in the first quantum well. When the thickness of the upper separate confinement layer meets a specific condition, the optical confinement factor of the TE mode and the optical confinement factor of the TM mode in the first quantum well are close to or equal to each other. Therefore, the confinement effect of the first quantum well on light in the TE mode is similar to or the same as that on light in the TM mode. The following provides descriptions by using an example.

Figure 7A:
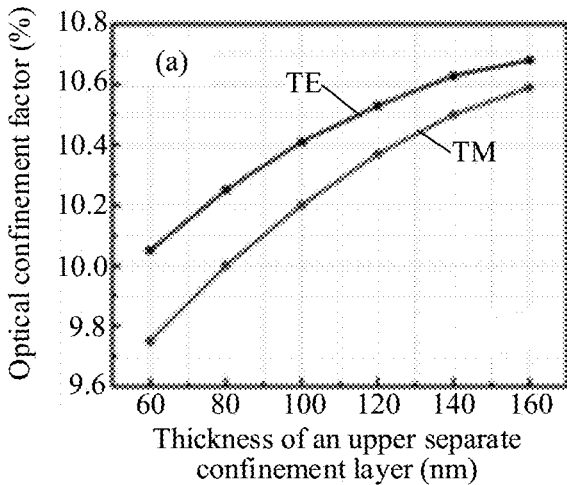
FIG. 7(*a*) is a diagram of a change trend of an optical confinement factor in a first quantum well with a thickness of an upper separate confinement layer.
Figure 7B:
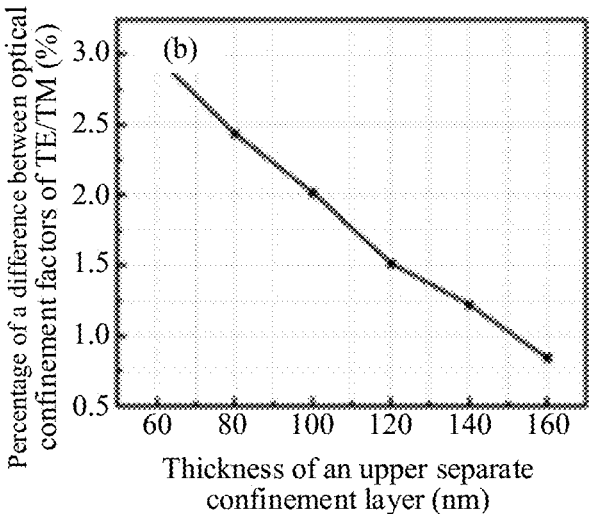

FIG. 7(a) is a diagram of a change trend of an optical confinement factor in a first quantum well with a thickness of an upper separate confinement layer. FIG. 7(b) is a diagram of a change trend of a percentage of a difference between optical confinement factors of a TE mode and a TM mode in a first quantum well with a thickness of an upper separate confinement layer. As shown in FIG. 7(a), a horizontal coordinate represents the thickness of the upper separate confinement layer, and a vertical coordinate represents the optical confinement factor in the first quantum well. It can be seen that both the optical confinement factor of the TE mode and the optical confinement factor of the TM mode in the first quantum well increase with the increase of the thickness of the upper separate confinement layer. When the thickness of the upper separate confinement layer is 85 nm, the optical confinement factor of the TE mode in the first quantum well is 10.3%, and the optical confinement factor of the TM mode in the first quantum well is 10.5%. As shown in FIG. 7(b), a horizontal coordinate represents the thickness of the upper separate confinement layer, and a vertical coordinate represents the percentage of the difference between the optical confinement factors of the TE mode and the TM mode in the first quantum well. It can be seen that the percentage of the difference between the optical confinement factors of the TE mode and the TM mode in the first quantum well decreases with the decrease of the thickness of the upper separate confinement layer. When the thickness of the upper separate confinement layer is 85 nm, the percentage of the difference between the optical confinement factors of the TE mode and the TM mode in the first quantum well is close to 2.2%.

Figure 8:
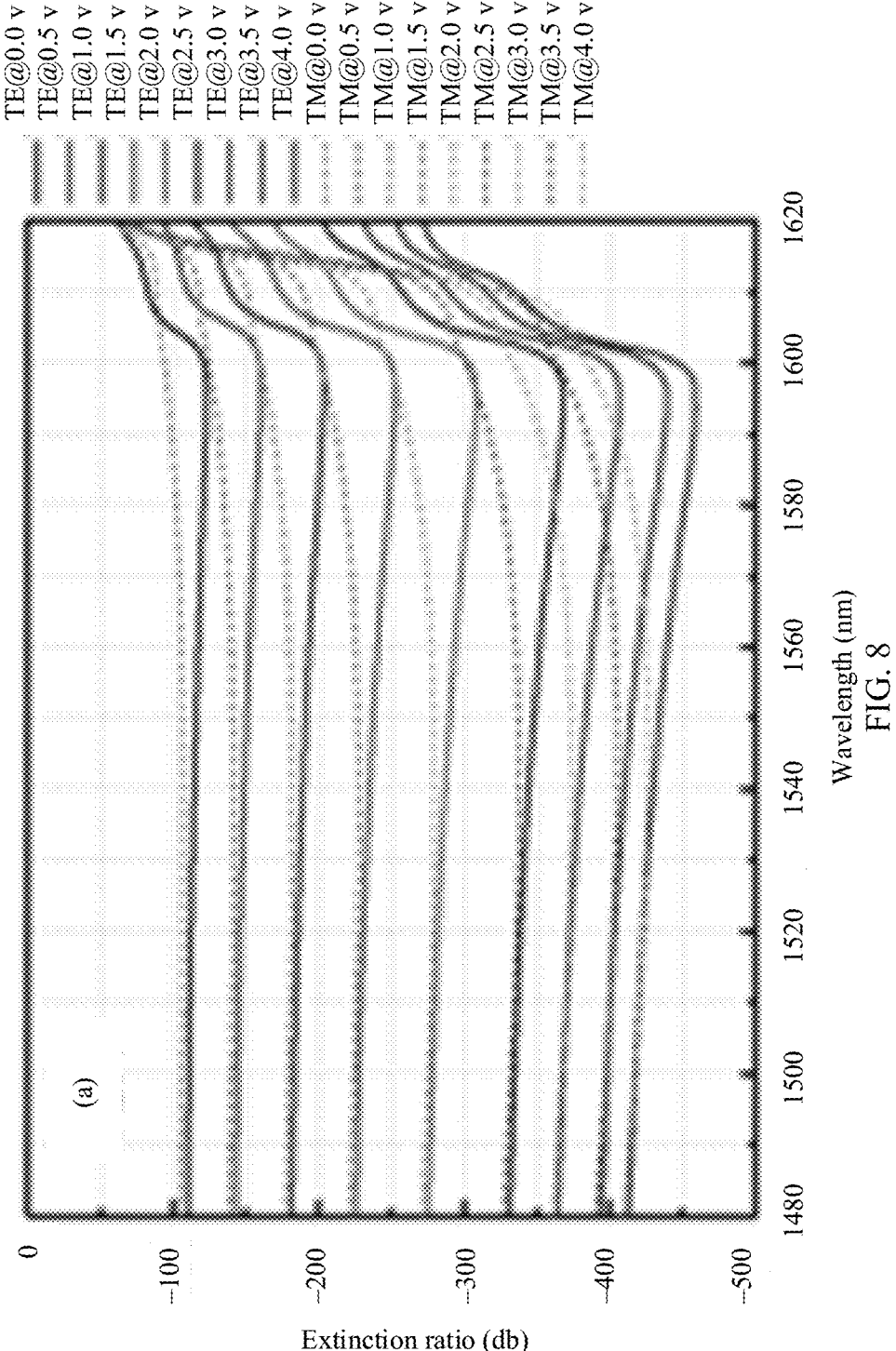
FIG. 8 is a schematic diagram of extinction ratios corresponding to a TE mode and a TM mode in an electric absorption modulator under different working voltage conditions.

It should be noted that, on a premise that the optical confinement factor of the TE mode and the optical confinement factor of the TM mode in the first quantum well are close to or equal to each other, material absorption coefficients of the TE mode and the TM mode in the first quantum well need to be close to or equal to each other, so that the extinction ratio corresponding to the TE mode and the extinction ratio corresponding to the TM mode in the electric absorption modulator are close to or equal to each other. Specifically, the stress of the first quantum well may affect material absorption coefficients of the TE mode and the TM mode. Therefore, when the stress of the first quantum well meets a specific condition, the material absorption coefficients of the TE mode and the TM mode are close to or equal to each other, so that the extinction ratio corresponding to the TE mode and the extinction ratio corresponding to the TM mode are close to or equal to each other. FIG. 8 is a schematic diagram of extinction ratios corresponding to a TE mode and a TM mode in an electric absorption modulator under different working voltage conditions. As shown in FIG. 8, a horizontal coordinate represents a wavelength, and a vertical coordinate represents an extinction ratio. It can be seen that, in a waveband of 1480 nm to 1550 nm, the extinction ratio corresponding to the TE mode and the extinction ratio corresponding to the TM mode are close to or equal to each other, so that the electric absorption modulator is insensitive to polarization.

In an embodiment of this application, an optical modulation and amplification apparatus includes an electric absorption modulator and a semiconductor optical amplifier sharing a same substrate and a same multi-layer material structure. When a thickness of the upper separate confinement layer 507 and a stress of the first quantum well 504 meet a design requirement, the electric absorption modulator is insensitive to polarization. When the thickness of the upper separate confinement layer 507 and the stress of the second quantum well 506 meet a design requirement, the semiconductor optical amplifier is insensitive to polarization. Therefore, even if the polarization direction of the injection light is random, performance of the optical modulation and amplification apparatus is not affected, in other words, the optical modulation and amplification apparatus provided in this application is insensitive to polarization. In addition, according to the design manner provided in this application, the electric absorption modulator and the semiconductor optical amplifier grow on the same substrate. This reduces the quantity of times of material epitaxy, and simplifies the process.

Figure 9:
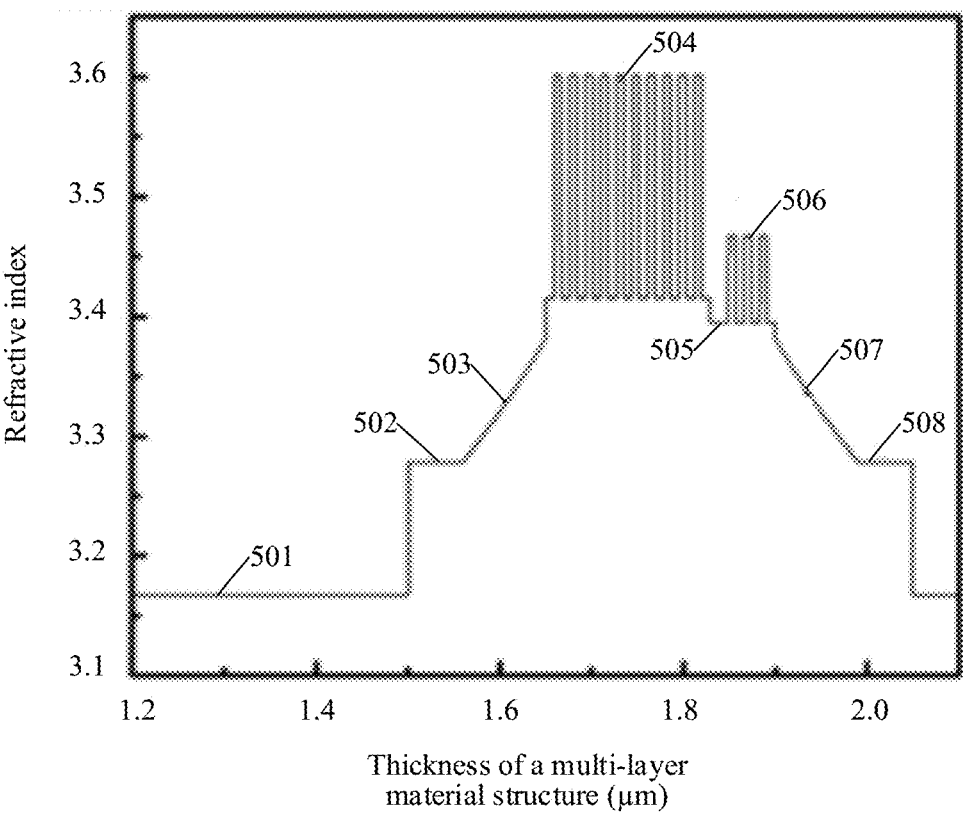
FIG. 9 is a schematic diagram of distribution of refractive indexes of a multi-layer structure material along a thickness direction.

Optionally, in some implementations, on a premise that a material absorption coefficient of the first quantum well is fixed, to obtain a high absorption coefficient, the electric absorption modulator needs to have more optical confinement factors in the first quantum well. To obtain high output power, the semiconductor optical amplifier needs to have few optical confinement factors in the second quantum well. Therefore, a material refractive index of the first quantum well should be greater than a material refractive index of the second quantum well. For example, the first quantum well uses a material of AlGaInAs, and the second quantum well uses a material of InGaAsP. FIG. 9 is a schematic diagram of distribution of refractive indexes of a multi-layer structure material along a thickness direction. As shown in FIG. 9, a horizontal coordinate is a thickness of the multi-layer material structure, and a vertical coordinate is the refractive index. It can be seen from the reference numerals corresponding to the multi-layer material structure shown in FIG. 3 that a refractive index of the first quantum well 504 is greater than a refractive index of the second quantum well 506. In this design manner, different requirements of the electric absorption modulator and the semiconductor optical amplifier for the optical confinement factors may be implemented in a same structure.

Based on this, to further implement that there are more optical confinement factors in the first quantum well, an overall length of the electric absorption modulator may be reduced, to reduce light absorbed in the first quantum well of the electric absorption modulator. For example, the overall length of the electric absorption modulator or a length L of the first waveguide is less than or equal to 400 μm.

Optionally, in some implementations, the multi-layer material structures on two sides of the semiconductor optical amplifier with the ridge waveguide structure of the second waveguide as an axis are symmetrical. In other words, thickness distribution of each layer of the material structure is uniform. In this manner, the thickness of the upper separate confinement layer may be limited, so that the upper separate confinement layer is not too thick, and the optical confinement factors in the first quantum well and the second quantum well are regulated separately. It can be learned from FIG. 5(a) that, a large thickness of the upper separate confinement layer may cause a large difference between the optical confinement factor of the TE mode and the optical confinement factor of the TM mode, and it may be difficult to implement insensitivity to polarization. In addition, a large thickness of the upper separate confinement layer may further cause more optical confinement factors in the second quantum well. This is not conducive to obtaining a high output power by the semiconductor optical amplifier.

Figures 10, 11:
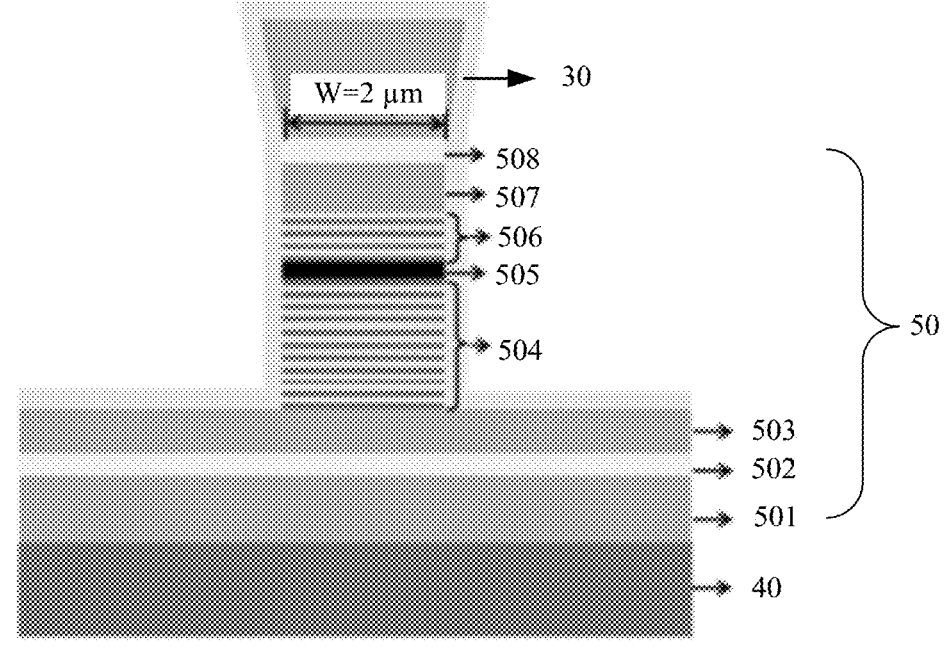
FIG. 10 is a second side view of an optical modulation and amplification apparatus according to an embodiment of this application.
FIG. 11 is a third schematic structural diagram of an optical modulation and amplification apparatus according to an embodiment of this application.

Optionally, in some implementations, the multi-layer material structures on the two sides of the electric absorption modulator that use the ridge waveguide structure of the first waveguide as an axis are etched, to form a structure of a deep ridge waveguide. This reduces impact of a parasitic capacitance and a junction capacitance on the electric absorption modulator. For example, FIG. 10 is a second side view of an optical modulation and amplification apparatus according to an embodiment of this application. As shown in FIG. 10, a width W of the ridge waveguide structure is 2 μm, and a first quantum well 504, an electron blocking layer 505, a second quantum well 506, an upper separate confinement layer 507, and inner P-cladding 508 on the two sides of the ridge waveguide structure are etched. It should be understood that, in an actual application, an etching depth may be selected based on an actual requirement. For example, multi-layer material structures on a buffer layer 501 on the two sides of the ridge waveguide structure may also be etched.

Based on this, to further reduce impact of the parasitic capacitance and the junction capacitance on the electric absorption modulator, a low-dielectric-constant material such as polyimide or benzocyclobutene may be further filled in an etched region. FIG. 11 is a third schematic structural diagram of an optical modulation and amplification apparatus according to an embodiment of this application. As shown in FIG. 11, a low-dielectric-constant material 90 is filled in the etched region in the electric absorption modulator 10.

In this embodiment, electrical isolation between the electric absorption modulator and the semiconductor optical amplifier may be implemented in a plurality of manners, which are separately described below.

In a first manner, protons or inert ions may be injected between the electric absorption modulator and a P-type electrode of the semiconductor optical amplifier, to implement electrical isolation between the electric absorption modulator and the semiconductor optical amplifier. The inert ions may be helium, neon, argon or other ions. It should be understood that, to make an overall structure of the optical modulation and amplification apparatus in this application more compact and reduce interference, a distance between the electric absorption modulator and the P-type electrode of the semiconductor optical amplifier should be controlled within a preset distance range.

In a second manner, a groove may be disposed between the electric absorption modulator and the semiconductor optical amplifier. For example, a part of the ridge waveguide structure is etched between the electric absorption modulator and the semiconductor optical amplifier to form a groove. The groove may increase an isolation resistor between the electric absorption modulator and the semiconductor optical amplifier, to implement electrical isolation between the electric absorption modulator and the semiconductor optical amplifier. It should be understood that, provided that electrical isolation between the electric absorption modulator and the semiconductor optical amplifier can be implemented, and normal operation of the electric absorption modulator and the semiconductor optical amplifier is not affected, a depth of the groove is not limited in this application. Optionally, to improve an electrical isolation effect, protons or inert ions may be further injected into the groove.

Figure 12:
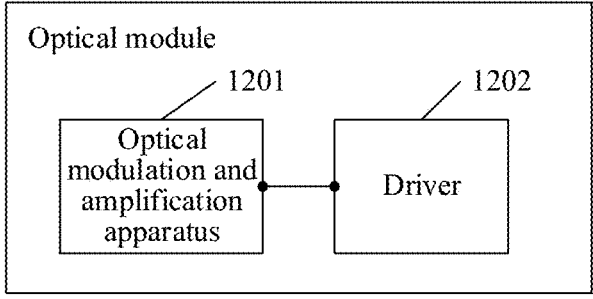
FIG. 12 is a schematic structural diagram of an optical module according to an embodiment of this application.

The optical modulation and amplification apparatus provided in this application is described above. Based on this, an embodiment of this application further provides an optical module. FIG. 12 is a schematic structural diagram of an optical module according to an embodiment of this application. The optical module includes an optical modulation and amplification apparatus 1201 described in the foregoing embodiments and a driver 1202. The driver is configured to drive the optical modulation and amplification apparatus to modulate and amplify injection light.

Figure 13:
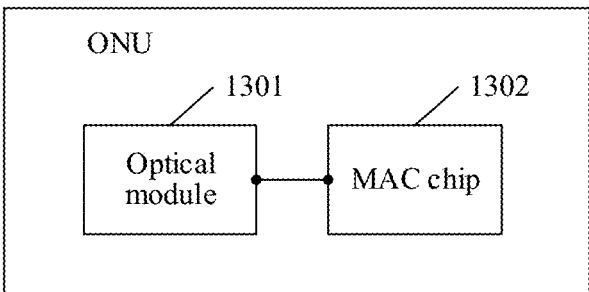
FIG. 13 is a schematic structural diagram of an ONU according to an embodiment of this application.

Further, an embodiment of this application further provides an ONU. FIG. 13 is a schematic structural diagram of an ONU according to an embodiment of this application. The ONU includes the optical module 1301 described in the embodiment shown in FIG. 12 and a MAC chip 1302. The optical module 1301 is configured to convert an electrical signal output by the MAC chip 1302 into an optical signal. It should be understood that the ONU is applied to a PON system. A light source in an OLT transmits injection light to the ONU, and the injection light is continuous light. The ONU modulates and amplifies the injection light by using an optical modulation and amplification apparatus in the optical module of the ONU, to generate an upstream optical signal. Then, the ONU sends the upstream optical signal to the OLT.

It should be noted that the foregoing embodiments are merely used to describe the technical solutions of this application, but are not intended to limit this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of embodiments of this application.

What is claimed is:

1. An optical modulation and amplification apparatus comprising:

an electric absorption modulator comprising a first waveguide and a second waveguide that are serially connected in a transmission direction of injection light, wherein the first waveguide and the second waveguide each comprise a ridge waveguide structure; and a semiconductor optical amplifier electrically isolated from the electric absorption modulator, wherein:

the electric absorption modulator and the semiconductor optical amplifier share a same substrate and use a same multi-layer material structure disposed on the substrate, the multi-layer material structure comprises, from bottom to top, a first quantum well configured to modulate the injection light, an electron blocking layer, a second quantum well configured to amplify the injection light, and an upper separate confinement layer, wherein the electron blocking layer is configured to block a current applied to the second quantum well from flowing into the first quantum well, a first difference between an extinction ratio corresponding to a transverse electric (TE) mode and an extinction ratio corresponding to a transverse magnetic (TM) mode in the electric absorption modulator is dependent on a thickness of the upper separate confinement layer and a stress of the first quantum well, and the first difference is less than or equal to a first preset value, and a second difference between a modal gain corresponding to the TE mode and a modal gain corresponding to the TM mode in the semiconductor optical amplifier is dependent on the thickness of the upper separate confinement layer and a stress of the second quantum well, and the second difference is less than or equal to a second preset value.

2. The optical modulation and amplification apparatus according to claim 1, wherein:

a third difference between an optical confinement factor of the TE mode and an optical confinement factor of the TM mode in the first quantum well is dependent on the thickness of the upper separate confinement layer and is less than or equal to a third preset value;

a fourth difference between a material absorption coefficient of the TE mode and a material absorption coefficient of the TM mode in the first quantum well is dependent on the stress of the first quantum well and is less than or equal to a fourth preset value; and the first difference is dependent on the third difference and the fourth difference.

3. The optical modulation and amplification apparatus according to claim 1, wherein:

a fifth difference between an optical confinement factor of the TE mode and an optical confinement factor of the TM mode in the second quantum well is dependent on the thickness of the upper separate confinement layer and is less than or equal to a fifth preset value;

a sixth difference between a material gain of the TE mode and a material gain of the TM mode in the second quantum well is dependent on the stress of the second quantum well and is less than or equal to a sixth preset value; and the second difference is dependent on the fifth difference and the sixth difference.

4. The optical modulation and amplification apparatus according to claim 1, wherein a material refractive index of the first quantum well is greater than a material refractive index of the second quantum well.

5. The optical modulation and amplification apparatus according to claim 1, wherein:

the multi-layer material structure comprises a cavity having two sides disposed adjacent to the semiconductor optical amplifier; and the two sides of the cavity are symmetrical with respect to an axis of the second waveguide.

6. The optical modulation and amplification apparatus according to claim 1, wherein:

the multi-layer material structure comprises a cavity disposed on two sides of the electric absorption modulator; and the cavity is disposed along an axis of the first waveguide.

7. The optical modulation and amplification apparatus according to claim 6, wherein the cavity is filled with polyimide or benzocyclobutene.

8. The optical modulation and amplification apparatus according to claim 1, wherein a thickness H of the upper separate confinement layer meets 75 nm≤H≤95 nm.

9. The optical modulation and amplification apparatus according to claim 1, wherein a length L of the first waveguide meets L≤400 μm.

10. The optical modulation and amplification apparatus according to claim 1, wherein widths W of the ridge waveguide structures of both the first waveguide and the second waveguide meet 1.5 μm≤W≤3 μm.

11. The optical modulation and amplification apparatus according to claim 1, further comprising:

a controller;

a voltage source having outputs coupled to the electric absorption modulator and a control input coupled to the controller; and a current source having outputs coupled to the semiconductor optical amplifier and a control input coupled to the controller, wherein the controller is configured to:

modulate the injection light by controlling a voltage provided by the voltage source to the electric absorption modulator, and modulate the injection light by controlling a current provided by the current source to the semiconductor optical amplifier.

12. The optical modulation and amplification apparatus according to claim 1, wherein a groove is disposed between an electrode of the electric absorption modulator and an electrode of the semiconductor optical amplifier to provide electrical isolation between the electric absorption modulator and the semiconductor optical amplifier.

13. The optical modulation and amplification apparatus according to claim 12, wherein protons or inert ions are configured to be injected into the groove.

14. An optical module, comprising:

an electric absorption modulator comprising a first waveguide and a second waveguide that are serially connected in a transmission direction of injection light, wherein the first waveguide and the second waveguide each comprise a ridge waveguide structure;

a semiconductor optical amplifier electrically isolated from the electric absorption modulator, wherein:

the electric absorption modulator and the semiconductor optical amplifier share a same substrate and use a same multi-layer material structure disposed on the substrate, the multi-layer material structure comprises, from bottom to top, a first quantum well configured to modulate the injection light, an electron blocking layer, a second quantum well configured to amplify the injection light, and an upper separate confinement layer, wherein the electron blocking layer is configured to block a current applied to the second quantum well from flowing into the first quantum well, a first difference between an extinction ratio corresponding to a transverse electric (TE) mode and an extinction ratio corresponding to a transverse magnetic (TM) mode in the electric absorption modulator is dependent on a thickness of the upper separate confinement layer and a stress of the first quantum well, and the first difference is less than or equal to a first preset value, and a second difference between a modal gain corresponding to the TE mode and a modal gain corresponding to the TM mode in the semiconductor optical amplifier is dependent on the thickness of the upper separate confinement layer and a stress of the second quantum well, and the second difference is less than or equal to a second preset value; and a driver configured to drive the electric absorption modulator and the semiconductor optical amplifier to modulate and amplify the injection light.

15. The optical module according to claim 14, wherein:

a third difference between an optical confinement factor of the TE mode and an optical confinement factor of the TM mode in the first quantum well is dependent on the thickness of the upper separate confinement layer and is less than or equal to a third preset value;

a fourth difference between a material absorption coefficient of the TE mode and a material absorption coefficient of the TM mode in the first quantum well is dependent on the stress of the first quantum well and is less than or equal to a fourth preset value; and the first difference is dependent on the third difference and the fourth difference.

16. The optical module according to claim 14, wherein:

a fifth difference between an optical confinement factor of the TE mode and an optical confinement factor of the TM mode in the second quantum well is dependent on the thickness of the upper separate confinement layer and is less than or equal to a fifth preset value;

a sixth difference between a material gain of the TE mode and a material gain of the TM mode in the second quantum well is dependent on the stress of the second quantum well and is less than or equal to a sixth preset value; and the second difference depends on the fifth difference and the sixth difference.

17. The optical module according to claim 14, wherein a material refractive index of the first quantum well is greater than a material refractive index of the second quantum well.

18. The optical module according to claim 14, wherein:

the multi-layer material structure comprises a cavity having two sides disposed adjacent to the semiconductor optical amplifier; and the two sides of the cavity are symmetrical with respect to an axis of the second waveguide.

19. An optical network unit (ONU), wherein the ONU comprises the optical module according to claim 14 and a media access control (MAC) chip, and the optical module is configured to convert an electrical signal output by the MAC chip into an optical signal.

20. The ONU according to claim 19, wherein a material refractive index of the first quantum well is greater than a material refractive index of the second quantum well.

21. A method of operating an optical modulation and amplification apparatus comprising: an electric absorption modulator comprising a first waveguide and a second waveguide that are serially connected in a transmission direction of injection light, wherein the first waveguide and the second waveguide each comprise a ridge waveguide structure; and a semiconductor optical amplifier electrically isolated from the electric absorption modulator, wherein the electric absorption modulator and the semiconductor optical amplifier share a same substrate and use a same multi-layer material structure disposed on the substrate, the multi-layer material structure comprises, from bottom to top, a first quantum well configured to modulate the injection light, an electron blocking layer, a second quantum well configured to amplify the injection light, and an upper separate confinement layer, wherein the electron blocking layer is configured to block a current applied to the second quantum well from flowing into the first quantum well, a first difference between an extinction ratio corresponding to a transverse electric (TE) mode and an extinction ratio corresponding to a transverse magnetic (TM) mode in the electric absorption modulator is dependent on a thickness of the upper separate confinement layer and a stress of the first quantum well, and the first difference is less than or equal to a first preset value, a second difference between a modal gain corresponding to the TE mode and a modal gain corresponding to the TM mode in the semiconductor optical amplifier is dependent on the thickness of the upper separate confinement layer and a stress of the second quantum well, and the second difference is less than or equal to a second preset value, the method comprising:

providing the injection light to the electric absorption modulator; and amplifying the injection light using the semiconductor optical amplifier.

* * * * *